United States Patent
Yoon et al.

(10) Patent No.: US 8,023,614 B2
(45) Date of Patent: Sep. 20, 2011

(54) COUNTING CIRCUIT AND ADDRESS COUNTER USING THE SAME

(75) Inventors: Mi Sun Yoon, Gunsan-si (KR); Chul Woo Yang, Kyeongki-do (KR); Sang Oh Lim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/839,253

(22) Filed: Jul. 19, 2010

(65) Prior Publication Data

US 2011/0013741 A1    Jan. 20, 2011

Related U.S. Application Data

(62) Division of application No. 12/164,018, filed on Jun. 28, 2008, now Pat. No. 7,760,847.

(30) Foreign Application Priority Data

May 21, 2008 (KR) .................. 10-2008-0047043

(51) Int. Cl.
    *H03K 23/00* (2006.01)
(52) U.S. Cl. .................. 377/118; 377/107; 377/119
(58) Field of Classification Search .................. None
    See application file for complete search history.

(56) References Cited

U.S. PATENT DOCUMENTS

| 5,818,895 A | 10/1998 | Oh |
| 6,826,249 B1 | 11/2004 | Younis |
| 6,879,654 B2 | 4/2005 | Austin |
| 7,003,067 B1 * | 2/2006 | Younis .......................... 377/46 |
| 7,092,480 B1 | 8/2006 | Younis |

FOREIGN PATENT DOCUMENTS

| KR | 1998-019210 | 6/1998 |
| KR | 100227140 B1 | 7/1999 |
| KR | 1019990062500 A | 7/1999 |
| KR | 1020020049387 A | 6/2002 |

* cited by examiner

*Primary Examiner* — Tuan Lam
(74) *Attorney, Agent, or Firm* — Kilpatrick Townsend & Stockton LLP

(57) ABSTRACT

A counting circuit includes first to fifth flip-flops (FFs) and a logic operation unit. Each of the first to fourth FFs has an initial value based on a preset control signal input through a 4-bit set terminal and outputs a signal according to a clock signal. The fifth FF is coupled to the output terminal of the fourth FF and is configured to output the output signal of the fourth FF synchronously with the clock signal. The logic operation unit logically combines the output signals of the second to fourth FFs and outputs first and second counting signals.

7 Claims, 5 Drawing Sheets

COUNTING CIRCUIT AND ADDRESS COUNTER USING THE SAME

CROSS-REFERENCES TO RELATED APPLICATIONS

The present application is a divisional of U.S. patent application Ser. No. 12/164,018, filed on Jun. 28, 2008, now issued U.S. Pat. No. 7,760,847, which claims priority of Korean patent application number 10-2008-0047043, filed on May 21, 2008, both of which are incorporated by reference in their entirety.

BACKGROUND OF THE INVENTION

The present invention relates to a counting circuit and, more particularly, to a high-speed counting circuit that enables random data input and an address counter using the same.

FIG. 1 is a block diagram showing the construction of a general high-speed counter.

A general high-speed counter 100 includes first to fourth flip-flops (FFs) 110 to 140 and first and second OR gates OR1, OR2. The high-speed counter 100 employs a ring counter structure and performs a 2-bit counting operation.

Each of the first to fourth FFs 110 to 140 has an input terminal D and an output terminal Q. A signal input to the input terminal D is output to the output terminal Q according to a clock CLK. Each of the first to fourth FFs 110 to 140 includes a set terminal S and a reset terminal R.

The input terminal D of the first FF 110 and the output terminal Q of the fourth FF 140 are connected. A preset control signal PRE is input to the set terminal S of the first FF 110. The output terminal Q of the first FF 110 is coupled to the input terminal D of the second FF 120. The output terminal Q of the second FF 120 is coupled to the input terminal D of the third FF 130.

The output terminal Q of the third FF 130 is coupled to the input terminal D of the fourth FF 140. The clock signal CLK is input to a clock terminal CK of each of the first to fourth FFs 110 to 140. The preset control signal PRE is input to the reset terminals R of the second to fourth FFs 120 to 140. The first to fourth FFs 110 to 140 are D FFs (flop-flops).

The first and second OR gates OR1, OR2 are configured to calculate the binary number of a 2-bit counter. An output signal of the third FF 130 and an output signal of the fourth FF 140 are input to the first OR gate OR1. The output of the first OR gate OR1 is a second bit B1, that is, a most significant bit (MSB).

An output signal of the second FF 120 and an output signal of the third FF 130 are input to the second OR gate OR2. The output of the second OR gate OR2 is a first bit B0, that is, a least significant bit (LSB).

The high-speed counter 100 performs a 2-bit count. This structure is called a unit counter block (UCB). In order to configure a 2N-bit counter, N high-speed counters 100 having the above UCB are required.

An operating principle of the high-speed counter 100 is described below. The first to fourth FFs 110 to 140 operate synchronously with the clock signal CLK. Thus, the first to fourth FFs 110 to 140 operate as a shift register.

The preset control signal PRE is applied to the set terminal S of the first FF 110, but to the reset terminals R of the second to fourth FFs 120 to 140. Accordingly, a reset state of the first to fourth FFs 110 to 140 becomes '1000'.

The high-speed counter 100 repeats states '1000', '0100', '0010', and '0001' synchronously with the clock signal CLK. The first and second bits B1, B0, that is, the outputs of the first and second OR gates OR1, OR2 are generated.

The high-speed counter 100 cannot input a reset state. That is, a reset state is always '1000', which makes the counting start value of the counter always fixed to '0'. However, the counter does not always start from '0', but sometimes has to perform a counting operation using randomly input values.

Several high-speed counters 100 may be coupled to construct a 4-bit or 8-bit counting circuit, and the output signal Q3 of the fourth FF 140 is used as a clock signal of a high-speed counter coupled to a next terminal. In this case, the output signal Q3 is not synchronized with the clock because of skew, etc potentially resulting in malfunction.

BRIEF SUMMARY OF THE INVENTION

The present invention is directed toward a counting circuit and an address counter employing the same, which can arbitrarily change an initial set value of the counter and control a clock signal to prevent operational error.

A counting circuit in accordance with an aspect of the present invention includes first to fifth flip-flops (FFs) and a logic operation unit. Each of the first to fourth FFs has an initial value decided according to a preset control signal input through a 4-bit set terminal and outputs a signal, input through its input terminal, through its output terminal according to a clock signal. The fifth FF is coupled to the output terminal of the fourth FF and configured to output the output signal of the fourth FF synchronously with the clock signal. The logic operation unit logically combines the output signals of the second to fourth FFs and outputs first and second counting signals.

Each of the first to fourth FFs has an output terminal coupled to an input terminal of a neighboring FF.

The logic operation unit includes a first logic gate for performing an OR operation on the output signal of the second FF and the output signal of the fourth FF, and for outputting the first counting signal, and a second logic gate for performing an OR operation on the output signal of the third FF and the output signal of the fourth FF, and for outputting the second counting signal.

A counting circuit in accordance with another aspect of the present invention includes a first counter unit having an initial value decided according to a first preset control signal input through a set terminal and configured to output first and second counting signals according to a clock signal, and to output a first control signal; a clock unit for outputting a control clock signal by employing the first control signal and the clock signal; and a second counter unit having an initial value decided by a second preset control signal input through a set terminal and configured to output third and fourth counting signals according to the control clock signal output from the clock unit.

The first counter unit includes first to fourth FFs, each having an initial value decided according to the first preset control signal, each of the first to fourth FFs being configured to output a signal, input through its input terminal, through its output terminal according to the clock signal; a fifth FF coupled to the output terminal of the fourth FF and configured to output the output signal of the fourth FF synchronously with the clock signal; and a logic operation unit for logically combining the output signals of the second to fourth FFs and for outputting the first and second counting signals.

The logic operation unit includes a first logic gate for performing an OR operation on the output signal of the second FF and the output signal of the fourth FF and for outputting the first counting signal; and a second logic gate for performing an OR operation on the output signal of the third FF and the output signal of the fourth FF and for outputting the second counting signal.

The clock unit includes a third logic gate for performing an AND operation on the first control signal and the clock signal; and a fourth logic gate for performing an OR operation on an output signal of the third logic gate and a second control signal and for outputting an operation result as the control clock signal.

The second counter unit includes sixth to ninth FFs, each having an initial value decided according to the second preset control signal and configured to output a signal, input through an input terminal, through an output terminal according to the clock signal; a tenth FF coupled to the output terminal of the ninth FF and configured to output the output signal of the ninth FF as a third control signal synchronously with the clock signal; and a logic operation unit for logically combining the output signals of the sixth to ninth FFs and for outputting the third and fourth counting signals.

The logic operation unit includes a fifth logic gate for performing an OR operation on the output signal of the seventh FF and the output signal of the ninth FF and for outputting the third counting signal; and a sixth logic gate for performing an OR operation on the output signal of the eighth FF and the output signal of the ninth FF and for outputting the fourth counting signal.

The second control signal is input at a high level synchronously with the clock signal in order to input the first and second preset control signals, for the purpose of a synchronous preset signal input.

The second control signal is maintained at a high level for the purpose of an asynchronous preset signal input.

A counting circuit in accordance with still another aspect of the present invention includes a first counter having an initial value decided according to input data input through a set terminal and configured to output first and second counting signals according to a clock signal, and to output a first control signal; a first clock unit for outputting a first control clock signal by employing the first control signal and the clock signal; a second counter having an initial value decided by input data and configured to output third and fourth counting signals according to the first control clock signal, and to output a second control signal; a second clock unit for outputting a second control clock signal by employing the second control signal and the first control clock signal; a third counter having an initial value decided by input data and configured to output fifth and sixth counting signals according to the second control clock signal, and to output a third control signal; a third clock unit for outputting a third control clock signal by employing the third control signal and the second control clock signal; and a fourth counter having an initial value decided by input data and configured to output seventh and eighth counting signals according to the third control clock signal.

Each of the first to fourth counters includes first to fourth FFs, each having an initial value decided by input data and configured to output a signal, input through its input terminal, through its output terminal according to the clock signal; a fifth FF coupled to the output terminal of the fourth FF and configured to output the output signal of the fourth FF synchronously with the clock signal; and a logic operation unit for logically combining the output signals of the second to fourth FFs and for outputting the first and second counting signals.

An address counter in accordance with still another aspect of the present invention includes a bit dividing unit for dividing an address signal; first to fourth multiplexers (MUXs) for outputting first to fourth preset signals, respectively, by employing address bits divided by the bit dividing unit; a first counter having an initial value decided by the first preset signal and configured to output first and second counting signals according to a clock signal, and to output a first control signal; a first clock unit for outputting a first control clock signal by employing the first control signal and the clock signal; a second counter having an initial value decided by the second preset signal and configured to output third and fourth counting signals according to the first control clock signal, and to output a second control signal; a second clock unit for outputting a second control clock signal by employing the second control signal and the first control clock signal; a third counter having an initial value decided by the third preset signal and configured to output fifth and sixth counting signals according to the second control clock signal, and to output a third control signal; a third clock unit for outputting a third control clock signal by employing the third control signal and the second control clock signal; and a fourth counter having an initial value decided by the fourth preset signal and configured to output seventh and eighth counting signals according to the third control clock signal.

Each of the first to fourth counters includes first to fourth FFs, each having an initial value decided by each of the first to fourth preset signals and configured to output a signal, input through its input terminal, through its output terminal according to the clock signal; a fifth FF coupled to the output terminal of the fourth FF and configured to output the output signal of the fourth FF synchronously with the clock signal; and a logic operation unit for logically combining the output signals of the second to fourth FFs and for outputting the first and second counting signals.

DESCRIPTION OF SPECIFIC EMBODIMENTS

Specific embodiments according to the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the present invention. The present invention is defined by the scope of the claims.

Figure 1:
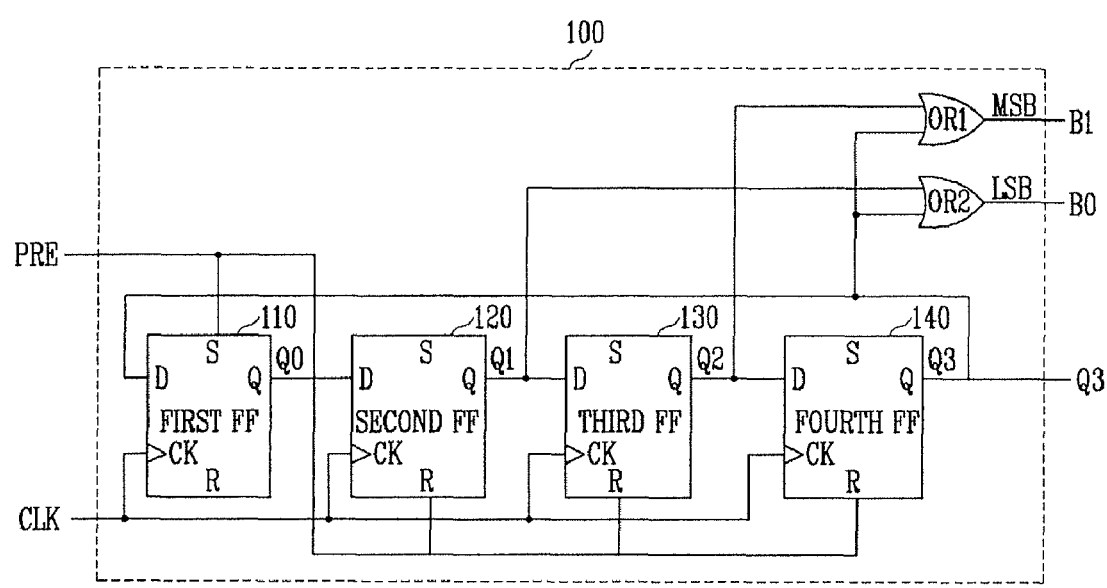
FIG. 1 is a block diagram showing the construction of a general high-speed counter.
Figure 2A:
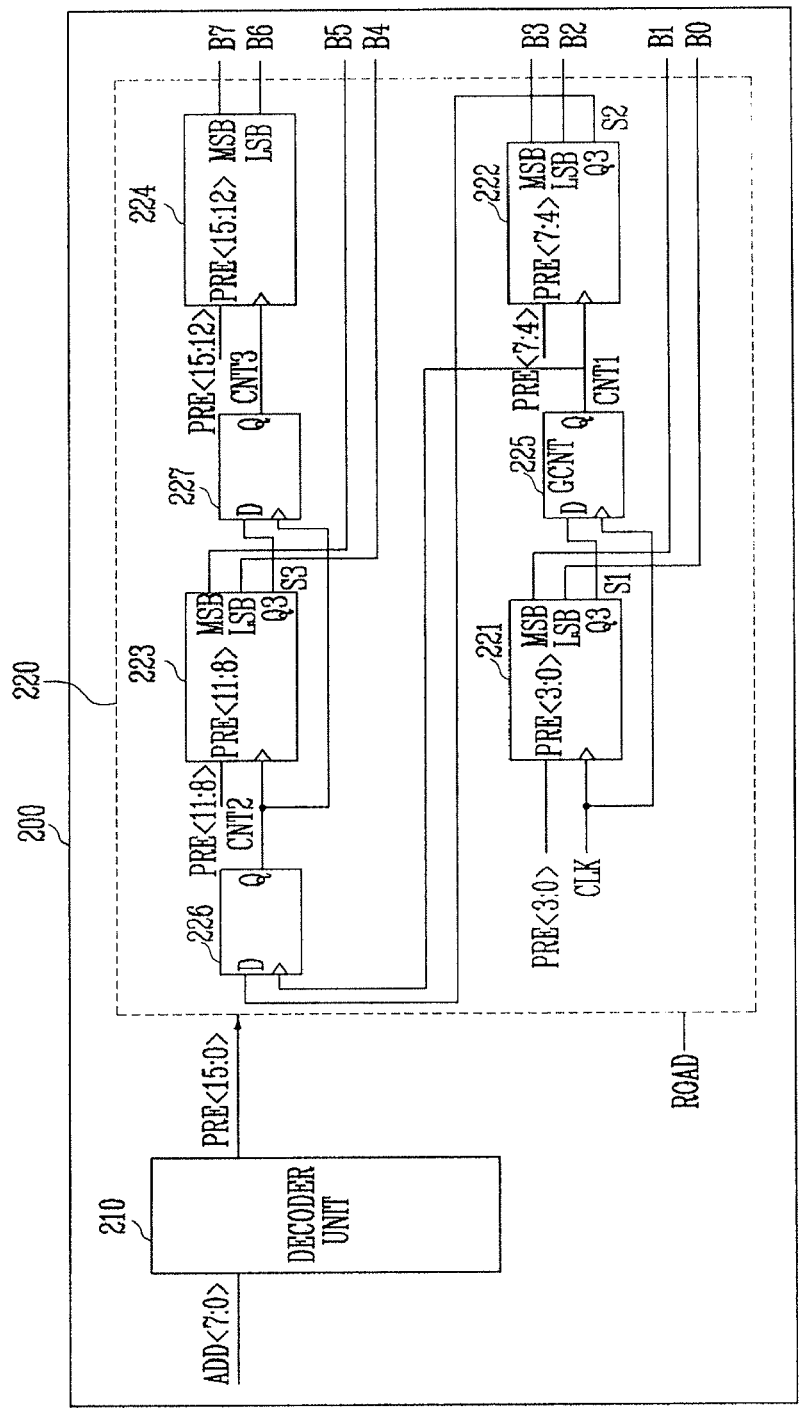
FIG. 2A is a block diagram showing the construction of an 8-bit counter employing a high-speed counting circuit in accordance with a first embodiment of the present invention.

FIG. 2A is a block diagram showing the construction of an 8-bit counter employing a high-speed counting circuit in accordance with a first embodiment of the present invention.

FIG. 2A shows that the 8-bit counter is used as an address counter for counting an 8-bit address.

Referring to FIG. 2A, an 8-bit counter 200 in accordance with an embodiment of the present invention includes a decoder unit 210 and a counter unit 220.

The decoder unit 210 decodes 8-bit address control signals ADD<7:0> into 16-bit preset signals PRE<15:0> and outputs a decoding result. A random value input to the counter unit 220 may be controlled by changing the address control signals ADD<7:0> arbitrarily. The counter unit 220 outputs 8-bit counting signals B<7:0> by employing the 16-bit preset signals PRE<15:0> output from the decoder unit 210.

The counter unit 220 includes first to fourth counters 221 to 224, and first to third clock units 225 to 227. Each of the first to fourth counters 221 to 224 outputs a 2-bit counting signal in response to a 4-bit preset signal. The first to third clock units 225 to 227 output first to third control clock signals CNT1 to CNT3 for the operation of the second to fourth counters 222 to 224 in response to a clock signal CLK, and first to third control signals S1 to S3 output from the first to third counter 221 to 223, respectively.

That is, the first counter 221 operates according to a first clock CLK, receives the preset signals PRE<3:0>, and outputs the first and second counting signals B<1:0> through first and second output terminals MSB, LSB. The first counter 221 also outputs the first control signal S1 through a third output terminal Q3. The first clock unit 225 receives the first control signal S1 through an input terminal D and the first clock signal CLK through a clock terminal, and outputs the first control clock signal CNT1 through an output terminal Q.

The second counter 222 receives the first control clock signal CNT1 through a clock terminal and preset signals PRE<7:4> through an input terminal. The second counter 222 outputs third and fourth counting signals B<2:3> through first and second output terminals MSB, LSB and outputs the second control signal S2 through the third output terminal Q3.

The second clock unit 226 receives the second control signal S2 through an input terminal D and the first control clock signal CNT1 through a clock terminal. The second clock unit 226 outputs the second control clock signal CNT2 through an output terminal Q.

The third counter 223 receives preset signals PRE<11:8> through an input terminal and the second control clock signal CNT2 through a clock terminal. The third counter 223 outputs fifth and sixth counting signals B<5:4> through first and second output terminals MSB, LSB and outputs the third control signal S3 through the third output terminal Q3.

The third clock unit 227 receives the third control signal S3 through an input terminal D and the second control clock signal CNT2 through a clock terminal. The third clock unit 227 outputs the third control clock signal CNT3 through an output terminal Q. A control signal ROAD is also input to the first to third clock units 225 to 227 in order to control the outputs of the first to third clock units 225 to 227.

The fourth counter 224 receives preset signals PRE<15:12> through an input terminal and the third control clock signal CNT3 through a clock terminal. The fourth counter 224 outputs seventh and eighth counting signals B<6:7> through first and second output terminals MSB, LSB.

As described above, the 8-bit counting signals B<7:0> are output through the first to fourth counters 221 to 224. Each of the first to fourth counters 221 to 224 is a counter circuit, which has an initial state set by the preset signal PRE and outputs a 2-bit counting signal.

The decoder unit 210 and the counter unit 220 of the 8-bit counter 200 are described in more detail below.

Figure 2B:
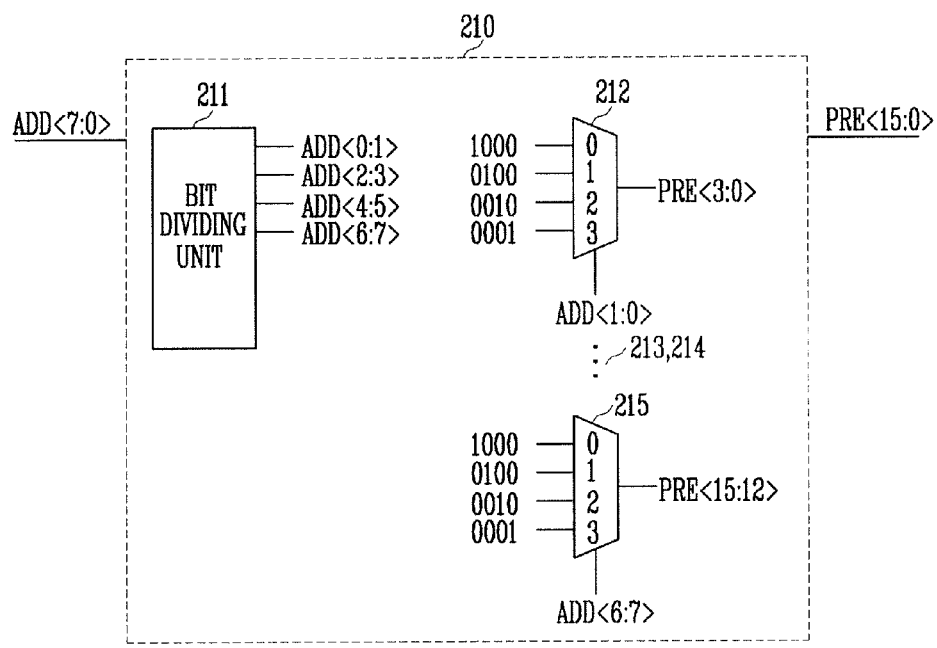
FIG. 2B is a block diagram of a decoder unit shown in FIG. 2A.

FIG. 2B is a block diagram of the decoder unit shown in FIG. 2A.

Referring to FIG. 2B, the decoder unit 210 includes a bit dividing unit 211 and first to fourth multiplexers (MUXs) 212 to 215 in order to output the address signals ADD<7:0>, which are input as 8 bits, as the 16-bit preset signals PRE<15:0>.

The bit dividing unit 211 divides the input address signals ADD<7:0> every two bits and outputs signals ADD<0:1>, ADD<2:3>, ADD<4:5>, and ADD<6:7>. The first to fourth MUXs 211 to 215 output the 4-bit preset signals, respectively, according to the address signals output from the bit dividing unit 211.

That is, the first MUX 212 outputs the preset signals PRE<3:0> according to the address signals ADD<0:1>. The second MUX 213 outputs the preset signals PRE<7:4> according to the address signals ADD<2:3>. The third MUX 214 outputs the preset signals PRE<11:8> according to the address signals ADD<4:5>. The fourth MUX 215 outputs the preset signals PRE<15:12> according to the address signals ADD<6:7>. That is, the first to fourth MUXs 212 to 215 are MUXs that output 2-bit data as a 4-bit signal. In the case in which 2N-bit data is input as a control signal by controlling the number of MUXs, the first to fourth MUXs 212 to 215 may output 4N-bit preset signals.

In the counter unit 220 that outputs the 8-bit counting signals B<7:0> according to the 16-bit preset signals PRE<15:0> output from the decoder unit 210, the first to fourth counters 221 to 224 have the same configuration and the first to third clock units 225 to 227 also have the same configuration.

Figure 2C:
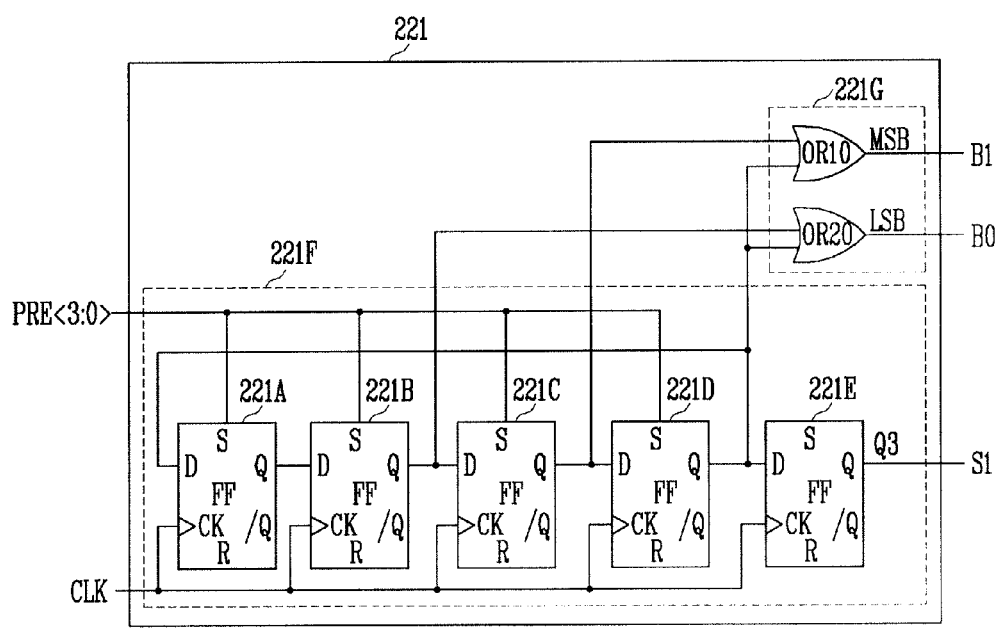
FIG. 2C is a block diagram of a first counter of a counter unit shown in FIG. 2A.

FIG. 2C is a block diagram of the first counter of the counter unit shown in FIG. 2A.

Referring to FIG. 2C, the first counter 221 includes first to fifth FFs 221A to 221E and first and second OR gates OR10, OR20. Each of the first to fifth FFs 221A to 221E outputs a signal, input through its input terminal D, through a first output terminal Q according to a clock input through a clock terminal. Each FF also outputs an inverted signal of a signal, which is output through the first output terminal Q, through a second output terminal /Q.

The second to fifth FFs 221B to 221E are also similarly constructed to the first FF 221A. An input terminal D of the second FF 221B is coupled to the output terminal Q of the first FF 221A. An input terminal D of the third FF 221C is coupled to an output terminal Q of the second FF 221B.

An input terminal D of the fourth FF 221D is coupled to an output terminal Q of the third FF 221C. An input terminal D of the fifth FF 221E is coupled to an output terminal Q of the fourth FF 221D.

The clock signal CLK is input to clock terminals CK of the first to fifth FFs 221A to 221E. Further, the preset signals PRE<3:0> are input to set terminals S of the first to fourth FFs 221A to 221D. Four bits of each of the preset signals PRE<3:0> is input to the set terminal S of each of the first to fourth FFs 221A to 221D on a bit-by-bit basis.

Initial values of the first to fourth FFs 221A to 221D are set according to the preset signals PRE<3:0>.

The first OR gate OR10 is applied with output signals of the third FF 221C and the fourth FF 221D. An output signal of the first OR gate OR10 is the second bit B1 output through the first output terminal MSB.

The second OR gate OR20 is applied with output signals of the second FF 221B and the fourth FF 221D. An output signal of the second OR gate OR20 is the first bit B0 output through the second output terminal LSB.

The first to fifth FFs 221A to 221E serve as data storage units for outputting data, which is reset by the preset signals PRE<3:0>, according to the clock signal CLK. The first and second OR gates OR10, OR20 serve as operators for performing OR operations on the output signals of the second to fourth FFs 221B to 221D and outputting operation results.

The second to fourth counters 222 to 224 operate similarly to the first counter 221, and output the third to eighth bits B<7:2>. The second counter 222 operates in response to the first control clock signal CNT1 output from the first clock unit 225. The third counter 223 operates in response to the second control clock signal CNT2 output from the second clock unit 226. The fourth counter 224 operates in response to the third control signal CNT3 output from the third clock unit 227.

The first control signal S1 output from the first counter 221 is output as follows.

Figure 2D:
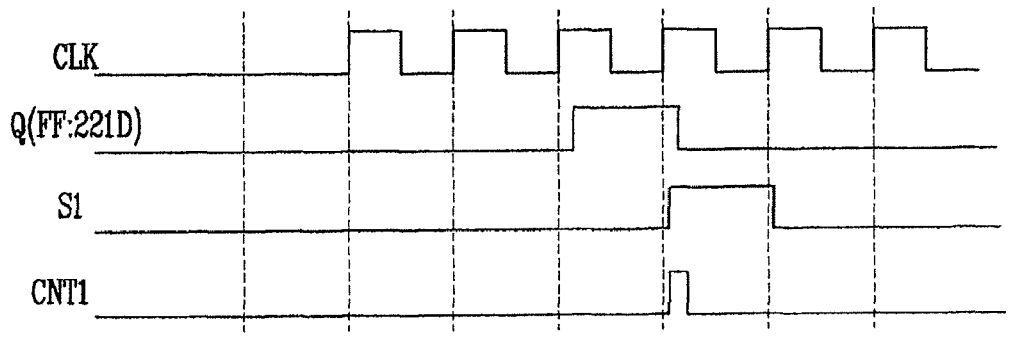
FIG. 2D is a timing diagram illustrating the output of a first control signal of FIG. 2C.

FIG. 2D is a timing diagram illustrating the output of the first control signal of FIG. 2C.

Referring to FIG. 2D, the first control signal S1 output from the first counter 221 synchronizes the output signal, output from the fourth FF 221D, according to the clock signal CLK and outputs a synchronized signal. Through this synchronization, a next second counter 222 operates once whenever the first counter 221 returns to an initially set value according to a fourth clock.

The first to third clock units 225 to 227 are constructed as follows in response to the first to third control signals S1 to S3.

Figure 2E:
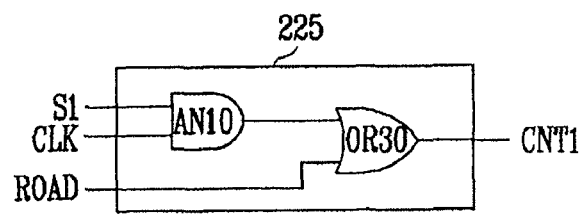
FIG. 2E shows a first clock unit shown in FIG. 2A.

FIG. 2E shows the first clock unit shown in FIG. 2A.

Referring to FIG. 2E, the first clock unit 225 includes a first AND gate AN10 and a third OR gate OR30.

The first AND gate AN10 is applied with the first control signal S1 and the clock signal CLK. An output signal of the first AND gate AN10 is input to the third OR gate OR30. The control signal ROAD is input to another input terminal of the third OR gate OR30. The control signal ROAD is a signal for enabling an operation. In the case in which random values are input synchronously, the values are synchronized using the control signal ROAD. In the case in which random values are input asynchronously, the control signal ROAD remains fixed at a high level. Further, the output of the third OR gate OR30 is the first control clock signal CNT1.

The second and third clock units 226, 227 are configured similarly to the first clock unit 225 except that the second and third clock units 226, 227 are applied with the first control clock signal CNT1 and the second control clock signal CNT2, respectively, instead of the clock signal CLK.

The first to third control clock signals CNT1 to CNT3 may have an error due to a skew phenomenon, which is caused by the first to third control signals S1 to S3, that is, gate clock signals. In order to prevent this problem, the first to third control signals S1 to S3 are output through the last FF of the first to fourth counters 221 to 223, that is, the first counter 221, for example, the output terminal Q of the fifth FF 221E.

As described above, the occurrence of error caused by a clock may be reduced by the first to third clock units 225 to 227 that output the control clock signals according to a control signal, which is synchronized and output by a previous counter.

The above method of inputting random values synchronously or asynchronously according to the control signal ROAD is described below.

Figure 3A:
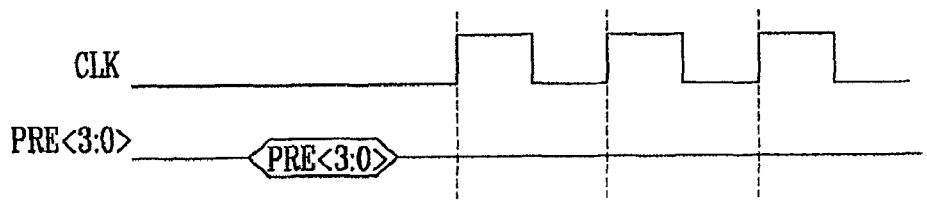
FIGS. 3A and 3B are timing diagrams illustrating the input of asynchronous or synchronous random values.
Figure 3B:
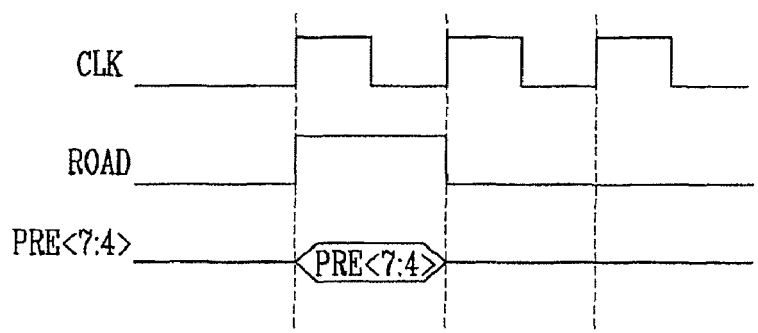

FIGS. 3A and 3B are timing diagrams illustrating the input of asynchronous or synchronous random values.

Referring to FIGS. 3A and 3B, in the case of the first to third clock units 225 to 227 that receive the preset signals PRE<3:0> as inputs, in the asynchronous method, data can be input without being synchronized since the control signal ROAD is fixed to a high level.

Further, in the synchronous method, the preset signals PRE<7:4> may be input and synchronized by inputting the control signal ROAD at a high level synchronously with a clock.

Each of the first to fourth counters 221 to 224 is a counter circuit which has an initial value set according to a 4-bit input signal and outputs a 2-bit counting signal. A 4-bit counting circuit may be configured using the counter circuit and the clock unit.

Figure 4:
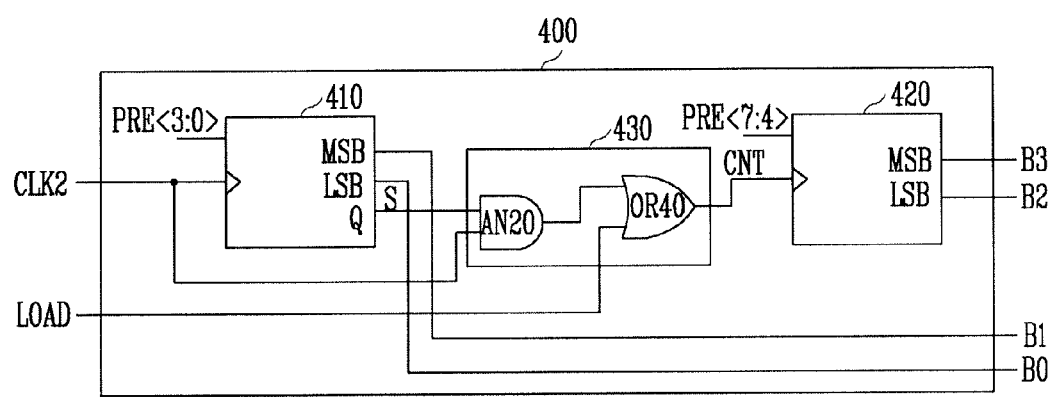
FIG. 4 is a block diagram showing a 4-bit counter circuit in accordance with a second embodiment of the present invention.

FIG. 4 is a block diagram showing a 4-bit counter circuit in accordance with a second embodiment of the present invention.

Referring to FIG. 4, a 4-bit counter circuit 400 includes first and second counters 410, 420 and a clock unit 430.

The first and second counter 410 and 420 have the same construction as that of the 2-bit counter circuit shown in FIG. 2C. The clock unit 430 outputs a control clock signal CNT, by employing a control signal S output from the first counter 410, a clock signal CLK2 and a control signal LOAD.

The second counter 420 outputs a 2-bit counting signal in response to the control clock signal CNT.

As described above, a counting circuit that outputs $2^N$ counting signals can be constructed by controlling the number of the counter circuits and the clock units.

As described above, the counting circuit and the address counter using the same in accordance with the present invention may control an initial value arbitrarily and may also control a clock signal in order to prevent error upon operation. Accordingly, a high-speed counting circuit is provided that may be freely set.

The embodiments disclosed herein have been proposed to allow a person skilled in the art to easily implement the present invention, and the person skilled in the art may implement the present invention by a combination of these embodiments. Therefore, the scope of the present invention is not limited by or to the embodiments as described above, and should be construed to be defined only by the appended claims and their equivalents.

What is claimed is:

1. A counting circuit, comprising:
   a first counter unit having an initial value based on a first preset control signal input through a set terminal and configured to output first and second counting signals based on a clock signal and to output a first control signal;
   a clock unit for outputting a control clock signal based on the first control signal and the clock signal; and
   a second counter unit having an initial value based on a second preset control signal input through a set terminal and configured to output third and fourth counting signals according to the control clock signal,
   wherein the first counter unit comprises:
   a first FF, a second FF, a third FF and a fourth FF, wherein each of the first to fourth FFS has an initial value based on the first preset control signal, each of the first to fourth FFs being configured to receive a signal at a corresponding input terminal, and output an output signal at a corresponding output terminal based on the clock signal;
   a fifth FF coupled to the output terminal of the fourth FF and configured to output the output signal of the fourth FF synchronously with the clock signal; and a logic operation unit for logically combining the output signals of the second to fourth FFs and for outputting the first and second counting signals.

2. The counting circuit of claim 1, wherein the logic operation unit comprises:
   a first logic gate for performing an OR operation on the output signal of the second FF and the output signal of the fourth FF and for outputting the first counting signal; and
   a second logic gate for performing an OR operation on the output signal of the third FF and the output signal of the fourth FF and for outputting the second counting signal.

3. The counting circuit of claim 1, wherein the clock unit comprises:
   a third logic gate for performing an AND operation on the first control signal and the clock signal; and
   a fourth logic gate for performing an OR operation on an output signal of the third logic gate and a second control signal and for outputting an operation result as the control clock signal.

4. The counting circuit of claim 1, wherein the second counter unit comprises:
   a sixth FF, a seventh FF, an eighth FF, and a ninth FF, wherein each of the sixth to ninth FFs have an initial value based on the second preset control signal and are configured to receive an input signal at a corresponding input terminal and output an output signal at a corresponding output terminal based on the clock signal;
   a tenth FF coupled to the output terminal of the ninth FF and configured to output the output signal of the ninth FF as a third control signal synchronously with the clock signal; and
   a logic operation unit for logically combining the output signals of the sixth to ninth FFs and for outputting the third and fourth counting signals.

5. The counting circuit of claim 4, wherein the logic operation unit comprises;
   a fifth logic gate for performing an OR operation on the output signal of the seventh FF and the output signal of the ninth FF and for outputting the third counting signal; and
   a sixth logic gate for performing an OR operation on the output signal of the eighth FF and the output signal of the ninth FF and for outputting the fourth counting signal.

6. The counting circuit of claim 3, wherein the second control signal is input at a high level synchronously with the clock signal in order to input the first and second preset control signals, the first and second preset control signals comprising a synchronous preset signal input.

7. The counting circuit of claim 3, wherein the second control signal is maintained at a high level to provide an asynchronous preset signal input.

* * * * *